United States Patent
Morishita

(10) Patent No.: US 6,455,895 B1
(45) Date of Patent: *Sep. 24, 2002

(54) OVERVOLTAGE PROTECTOR HAVING SAME GATE THICKNESS AS THE PROTECTED INTEGRATED CIRCUIT

(75) Inventor: Yasuyuki Morishita, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/295,340

(22) Filed: Apr. 21, 1999

(30) Foreign Application Priority Data

Apr. 23, 1998 (JP) .......................... 10-113050

(51) Int. Cl.$^7$ .............................. H01L 23/62
(52) U.S. Cl. .................. 257/355; 257/356; 257/357; 438/199; 438/197; 438/225
(58) Field of Search ............... 438/100, 197–99, 438/309, 334–36, 204, 225; 257/69, 355–360; 422/186.28

(56) References Cited

U.S. PATENT DOCUMENTS

| | | | | |
|---|---|---|---|---|
| 5,399,960 A | * | 3/1995 | Gross | 323/313 |
| 5,610,427 A | * | 3/1997 | Shida | 257/362 |
| 5,663,082 A | * | 9/1997 | Lee | 438/234 |
| 5,675,168 A | * | 10/1997 | Yamashita et al. | 257/355 |
| 5,745,323 A | * | 4/1998 | English et al. | 361/56 |
| 5,998,245 A | * | 12/1999 | Yu | 438/140 |
| 6,034,854 A | * | 3/2000 | Suga | 361/56 |
| 6,097,064 A | * | 8/2000 | Saitoh et al. | 257/345 |
| 6,121,090 A | * | 9/2000 | Wu | 438/275 |

FOREIGN PATENT DOCUMENTS

| | | |
|---|---|---|
| JP | 61-24268 | 7/1986 |
| JP | 61-207051 | 9/1986 |
| JP | 2-146773 | 6/1990 |
| JP | 6-188377 | 7/1994 |
| JP | 7-321320 | 12/1995 |
| JP | 2504838 | 4/1996 |

\* cited by examiner

*Primary Examiner*—Matthew Smith
*Assistant Examiner*—Granvill D. Lee
(74) *Attorney, Agent, or Firm*—McGinn & Gibb, PLLC

(57) ABSTRACT

A semiconductor integrated circuit having an input protection device which is suitable for receiving inputs of signals having voltages higher than the internal power supply voltage is provided. The input protection device consists of an offset NMOS transistor in which one of heavily doped N-type diffusion layers is electrically connected to a signal input terminal of the semiconductor integrated circuit. In the NMOS transistor, the field isolation structure is a trench structure, and the heavily doped N-type diffusion layers are offset from the gate electrode. Since a parasitic bipolar action easily occurs according to this construction, the protective function against overcurrent caused by static electricity or the like is not impaired. Since signal voltages are by no means applied directly to the gate oxide of the protection device during normal operation, signals with voltages higher than the internal power supply voltage can be input.

9 Claims, 4 Drawing Sheets

OVERVOLTAGE PROTECTOR HAVING SAME GATE THICKNESS AS THE PROTECTED INTEGRATED CIRCUIT

BACKGROUND OF THE INVENTION

1. Field of the Invention

The present invention relates to semiconductor integrated circuits. More specifically, the present invention particularly relates to semiconductor integrated circuits comprising an input protection device which is suitable for receiving inputs of signals having voltages higher than the internal power supply voltage.

This application is based on patent application No. Hei 10-113050 filed in Japan, the content of which is incorporated herein by reference.

2. Description of Related Art Including Information Disclosed Under 37 CFR 1.97 and 37 CFR 1.98

In a semiconductor integrated circuit, an input protection device is normally electrically connected to an input signal conductor in order to prevent overcurrent flow due to static electricity or the like. For a semiconductor integrated circuit into which a signal with a voltage (hereinafter referred to as a "signal voltage") higher than the internal power supply voltage is input from an external input terminal (hereinafter referred to as an "input terminal") of the input signal conductor, a MOS transistor having a structure which is the same as that of a MOS transistor which constitutes at least a part of the internal circuit of the semiconductor integrated circuit cannot be used as a switching element in the input protection device. This is because the thickness of the gate oxide ("internal gate oxide") of the MOS transistor in the internal circuit is optimized for the internal power supply voltage, and therefore, if a MOS transistor having the same structure as that of the MOS transistor in the internal circuit is used as the above switching element, a signal voltage higher than the internal power supply voltage is applied to the gate oxide, degrading the reliability of the semiconductor integrated circuit. The "internal power supply voltage" is the voltage applied in order to drive a semiconductor integrated circuit.

Accordingly, in such a conventional input protection device which is connected to a semiconductor integrated circuit, a lateral bipolar transistor in which a field oxide is used (see Japanese Patent Application, First Publication (Kokai), No. Hei 6-188377), or a MOS transistor having a gate oxide thicker than the internal gate oxide, is used as a protection element. In the following, conventional input protection devices will be described by citing examples.

FIGS. 3A and 3B are, respectively, a sectional side view showing a structure of a lateral bipolar transistor-type protection element having a field oxide (hereinafter referred to as a "field oxide lateral bipolar transistor-type protection element"), which is formed in a P-substrate (or a P-well), and a circuit diagram showing its equivalent circuit. In a P-substrate (p-well) 6, a field oxide 11 is formed, on both sides of which heavily doped N-type diffusion layers 2 are formed. One of the heavily doped N-type diffusion layers 2 is connected to an input terminal 1, and the other is connected to a grounding terminal 5.

When a pulse with a voltage higher than the preset voltage set for the semiconductor, such as a high voltage pulse caused by static electricity, is applied to the input terminal 1, the heavily doped N-type diffusion layers 2, which are separated by the field oxide 11, and the P-type substrate (P-type well) 6 operate as a lateral NPN bipolar transistor 12, which lets overcurrent run to the grounding terminal 5, protecting the voltage converter circuit 7 and the internal circuit 8 of the semiconductor integrated circuit.

FIGS. 4A and 4B are, respectively, a sectional side view showing a structure of an n-channel MOS transistor-type protection element having a thick gate oxide and a circuit diagram showing its equivalent circuit. As with the field oxide lateral bipolar transistor-type protection element, when a high voltage pulse caused by static electricity or the like is applied to the input terminal 1, the n-channel MOS transistor (NMOS transistor) 14 operates as a parasitic NPN bipolar transistor, which lets overcurrent run to the grounding terminal 5, protecting the voltage converter circuit 7 and the internal circuit 8 of the semiconductor integrated circuit. Since a heavily doped N-type diffusion layer 2 which is formed in a P-substrate (P-well) 6, and which is connected to the input terminal 1, overlaps with the gate polysilicon 3 (see FIG. 4A), a signal voltage is applied to the gate oxide 13 during normal operation. Accordingly, when signal voltages are higher than the internal power supply voltage, the gate oxide 13 must be thick enough not to degrade the reliability under high signal voltages.

As semiconductor integrated circuits have become finer, trench structures have been replacing LOCOS structures as field isolation structures in conventional field oxide lateral bipolar transistor-type protection elements; since a field oxide as an isolation oxide in a trench structure reaches a deeper position than one in a LOCOS structure does, the base thickness in the bipolar action is thicker. Accordingly, there have been the problems that it is difficult to perform the bipolar action, and that the protective function is impaired. On the other hand, with a MOS transistor-type protection element, when signals with voltages higher than the internal power supply voltage are input to the input terminal, the gate oxide of the protection element must be thicker than the internal gate oxide. There has been a problem that this requires an increased number of production steps, and makes the production process complicated.

Japanese Patent Application, First Publication (Kokai), No. Hei 6-188377 discloses an input/output protection device for a semiconductor integrated circuit device comprising a semiconductor substrate of one conductivity type, a well of conductivity type opposite to said one conductivity type formed on the surface of the semiconductor substrate, a heavily doped source region of said one conductivity type formed on the surface of the well, a heavily doped drain region, and a thick film gate insulator, the input/output protection device being characterized in that the heavily doped drain region is connected to an external input/output terminal, that the heavily doped source region is connected to a terminal at a power supply potential, and that an external potential is not given to the well. The thick film MOS transistor structure formed by adding a gate electrode having the thick film gate insulator allows the input/output protection device to break down the reverse-biased PN junction with a low potential of the external input/output terminal when a surge pulse is applied, and accordingly, a high surge withstand voltage level can be obtained.

Japanese Patent Publication No. 2504838 discloses an input/output protection device for a semiconductor integrated circuit comprising a first conductivity type diffused resistor connected to an external terminal, the first conductivity type diffused resistor being formed in a second conductivity type well in a region which is electrically isolated from a second conductivity type substrate by being surrounded by a first conductivity type buried layer and a first conductivity type well in which a first conductivity type diffused layer which is connected to a terminal at a power supply potential, the protection device being characterized in that a MOS transistor is inserted in which a gate terminal is connected to the first conductivity type diffused resistor which is connected to the external terminal, a drain terminal is connected to a second conductivity type diffused layer which is formed in the second conductivity type well, and a source terminal is connected to a ground potential. This structure prevents the second conductivity type well from accumulating electrical charge even if the potential of the input terminal is fixed to the power supply voltage level, and allows the semiconductor integrated circuit to operate without loosing its inherent performance even after the potential of the input terminal is switched to the L level after the semiconductor integrated circuit has been operated for a substantial length of time.

BRIEF SUMMARY OF THE INVENTION

In view of the circumstances described above, a semiconductor integrated circuit having an input protection device which is capable of taking inputs of signals with voltages higher than the internal power supply voltage, which may have a trench structure employed as a field isolation structure, and which is suitable for receiving inputs of signals with voltages higher than the internal power supply voltage has been desired. Accordingly, the object of the present invention is to provide a semiconductor integrated circuit comprising an input protection device which is suitable for receiving inputs of signals having voltages higher than the internal power supply voltage.

In order to achieve the above object, the present invention provides a semiconductor integrated circuit comprising an input protection device which comprises a switching element and which is interposed between an input signal conductor and a grounding conductor so as to provide conduction from the input signal conductor to the grounding conductor when a signal voltage higher than a preset value is applied, wherein the switching element is an offset MOS transistor.

According to the above construction, even if the field isolation structure is in a trench structure instead of a LOCOS structure, a signal with a voltage higher than the internal power supply voltage can be input without impairing the protective function against overcurrent caused by static electricity or the like. In addition, since a voltage of an input signal is not applied to the gate oxide during normal operation, the thickness of the gate oxide of the input protection device (protection element) can be the same as that of the internal gate oxide. Accordingly, when the input protection device is formed in the production steps of the semiconductor integrated circuit, the process for producing such a semiconductor integrated circuit is simple, without necessitating the addition of a new step to conventional production steps.

In this specification, an "offset MOS transistor" means a MOS transistor in which either one of the source region and the drain region of the MOS transistor is offset, or set back, from the gate electrode of the MOS transistor, whereby the interface of said one region and the interface of the gate electrode, which are adjacent to each other, are separated at a predetermined distance. The predetermined distance is determined taking account of various parameters such as the voltages of the signals to be input and the internal power supply voltage.

A semiconductor integrated circuit according to the present invention is particularly effective where signals with voltages higher than that of the internal power supply voltage are input thereto through an input signal conductor.

DETAILED DESCRIPTION OF THE INVENTION

When practicing the present invention, it is preferable that either one of the source region and the drain region of the offset MOS transistor be electrically connected to the input signal conductor, that the other region be electrically connected to the grounding conductor, and that the gate electrode of the offset MOS transistor be in an offset position from said one region.

Preferably, the offset MOS transistor is an n-channel MOS transistor, and the gate electrode of the offset MOS transistor and said other region of the offset MOS transistor are grounded.

In addition, the gate electrode of the offset MOS transistor may be in an offset position from said other region.

Since the MOS transistor constituting the input protection device in the present invention is an offset MOS transistor, signal voltages are by no means applied directly to the gate oxide of the protection device during normal operation. Accordingly, at least a part of the semiconductor integrated circuit may consist of a MOS transistor, and the gate oxide of the MOS transistor of the semiconductor integrated circuit may have the same thickness as that of the gate oxide of the offset MOS transistor, without causing any problem.

Accordingly, since there is no need for making the gate oxide of the protection device thicker than the internal gate oxide, the input protection device in the present invention can be easily produced without increasing the number of steps in the production process.

According to the present invention, even if a trench structure is employed instead of a LOCOS structure as a field isolation structure in order to make the semiconductor integrated circuit finer, a parasitic bipolar action can be easily performed without impairing the protective function against overcurrent caused by static electricity or the like. That is to say, the field isolation structure in the offset MOS transistor may be a trench structure.

A semiconductor integrated circuit according to the present invention may comprise a second input protective device which comprises a second switching element and which is interposed between a power supply terminal at a predetermined potential and the input signal conductor, wherein the second switching element is an offset MOS transistor.

The tolerance range for the predetermined potential is determined taking account of various parameters such as voltages of signals to be input and the internal power supply voltage.

Accordingly, a semiconductor integrated circuit which is protected more securely can be realized.

Embodiments are given below, making reference to the attached drawings, so as to illustrate practical forms of the present invention specifically and in more detail.

EMBODIMENTS 1

Figure 1A:
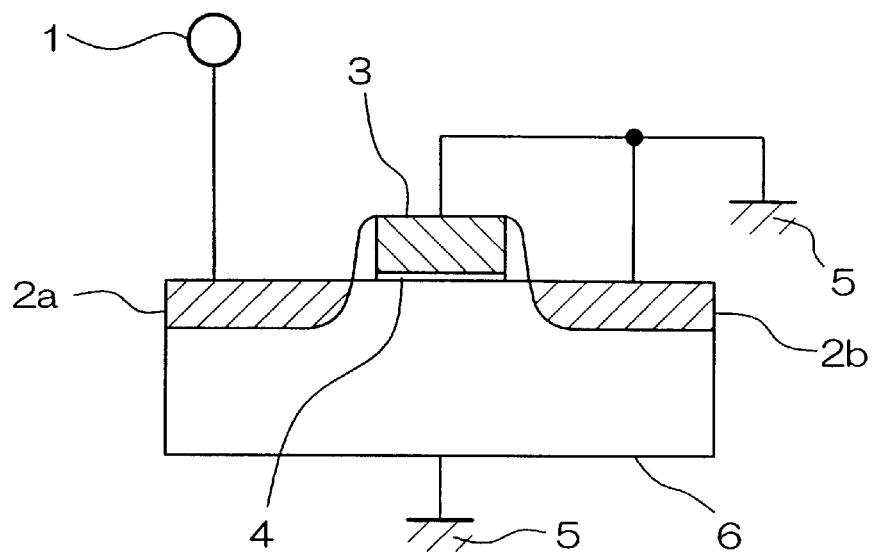
FIGS. 1A and 1B are, respectively, a sectional side view showing the structure of the input protection device of the semiconductor integrated circuit in Embodiment 1 and a circuit diagram showing its equivalent circuit.
Figure 1B:
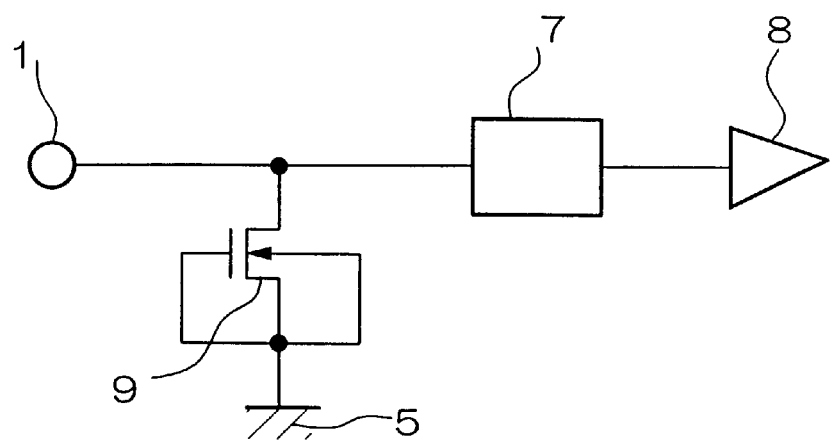

Embodiment 1 is an embodiment of the present invention, in which the MOS transistor is an NMOS transistor. FIGS. 1A and 1B are, respectively, a sectional side view showing the structure of the semiconductor integrated circuit of this embodiment and a circuit diagram showing its equivalent circuit.

The semiconductor integrated circuit of this embodiment comprises a heavily doped N-type diffusion layer 2a connected to an input terminal 1, a gate polysilicon 3 connected to a grounding terminal 5, a thin gate oxide 4, a heavily doped N-type diffusion layer 2b connected to the grounding terminal, and a P-substrate (P-well) 6 connected to the grounding terminal 5. The thickness of the thin gate oxide is equal to those of gate oxides of a voltage converter circuit 7 and an internal circuit 8. The heavily doped N-type diffusion layers 2a, 2b are set back from the ends of the gate polysilicon 3 and the thin gate oxide 4, which is a thin film. Thus, the input protection device in this embodiment is a MOS transistor of an offset structure, i.e., an offset MOS transistor 9.

When producing the semiconductor integrated circuit of this embodiment, the input protection device is produced as a MOS transistor 9 of an offset structure by conducting ion implantation for forming a lightly doped drain (LDD) region except for a region for the protection element.

There may be a case in which the offset distance, i.e., the distance from the end of gate polysilicon to the heavily doped diffusion layer, obtained using a side wall spacer alone, may not be sufficient for a certain level of input signal voltage and a certain concentration of impurity. In such a case, when ion implantation is conducted for a heavily doped source/drain (SD) region, a patterned photoresist film must be provided as a mask, and the offset distance must be optimized for the level of the input signal voltage and the concentration of impurity in the heavily doped N-type diffusion layer 2a.

Since no signal voltage is applied to the heavily doped N-type diffusion layer 2b connected to the grounding terminal 5, the heavily doped N-type diffusion layer 2b does not have to be set back from the gate polysilicon 3 and the thin gate oxide 4, that is, the heavily doped N-type diffusion layer 2b does not have to be in an offset position.

Next, operation of the semiconductor integrated circuit of this embodiment will be described. If a high voltage pulse with a voltage higher than a preset value is applied to the input terminal 1, the PN junction between the heavily doped N-type diffusion layer 2a and the P-substrate (P-well) is broken down, and thereafter substrate current due to impact ionization is generated at the PN junction. When the substrate current flows in the P-substrate (P-well) 6, a potential difference occurs between the P-substrate (P-well) 6 and the heavily doped N-type diffusion layer 2b. When the PN junction is forwardly biased here, the NMOS transistor 9, which is the input protection device in the semiconductor integrated circuit of this embodiment, operates as a lateral NPN bipolar transistor. Since this bipolar action allows overcurrent to bypass and flow to the grounding terminal 5, the voltage converter circuit 7 and the internal circuit 8 can be protected from overcurrent. The above operation is common to NMOS transistors for input protection.

According to this embodiment, since the heavily doped N-type diffusion layer 2a, the gate polysilicon 3, and the thin gate oxide 4 form an offset structure, even if the thickness of the thin gate oxide 4 is equal to those of the gate oxides of the voltage converter circuit 7 and the internal circuit 8, no voltage stress is put on the thin gate oxide 4 during normal operation, and signals with voltages higher than the internal power supply voltage can be input to the input terminal 1.

In the following Example, a specific example of Embodiment 1 and a process for producing it are described.

EXAMPLE

In the semiconductor integrated circuit of this example, the power supply voltage of the internal circuit 8 is 3.3 V, and the thickness of the thin gate oxide 4 in the input protection device is the same as those of the gate oxides of the voltage converter circuit 7 and the internal circuit 8, which is 80 angstroms.

According to this example, the gate polysilicon 3 and the thin gate oxide 4 were formed on the P-well 6 having an impurity concentration of about $1 \times 10^{18}/cm^3$ so as to make the gate length about 0.4 µm, and an LDD region was formed by conducting ion implantation with phosphorus only for the NMOS regions of the voltage converter circuit 7 and the internal circuit 8. The dosage of phosphorus implanted was $1 \times 10^4/cm^2$.

Then, the oxide was grown by about 1500 angstroms. After a side wall spacer was formed by etchback, ion implantation with arsenic was conducted for the entire NMOS region until the dosage reached $2 \times 10^{15}/cm^2$. As a result, no LDD region is formed in the NMOS transistor 9 as a protection element, i.e., in the input protection device, and the input protection device is formed in an offset structure in which the heavily doped N-type diffusion layer 2a is set back from the end of the gate polysilicon 3 (FIG. 1A).

When a signal with a voltage of 5 V is input to the input terminal of the semiconductor integrated circuit according to this example, the width of a depletion layer extending from the heavily doped N-type diffusion layer 2a to the P-well 6 is about 0.1 µm, and the depletion layer does not reach beyond the distance of the side wall spacer; therefore, no stress due to input signal voltages is put on the thin gate oxide 4, and the reliability of the semiconductor integrated circuit is never degraded.

In addition, the number of steps for producing the semiconductor integrated circuit of this example is about 20 steps less than that for producing a conventional semiconductor integrated circuit, i.e., a semiconductor integrated circuit which is made capable of taking inputs of signals with a voltage of 5 V by making only a gate oxide of a protection element as an input protection device thick.

TEST EXAMPLE

With an interface which allows inputs of signals with a voltage of 5 V at the internal power supply voltage of 3.3 V, a human body model (HBM) electrostatic discharge (ESD) application test was conducted on a conventional field oxide lateral NPN bipolar transistor-type protection element in which the field isolation structure was a trench structure with a depth of 5000 angstroms. The result showed that the conventional field oxide lateral NPN bipolar transistor-type protection element possessed a withstand voltage of only 500 V or less.

In contrast, an HBM-ESD application test conducted in the same manner on the input protection device of the above example showed a withstand voltage of at least 2000 V.

EMBODIMENT 2

Figure 2A:
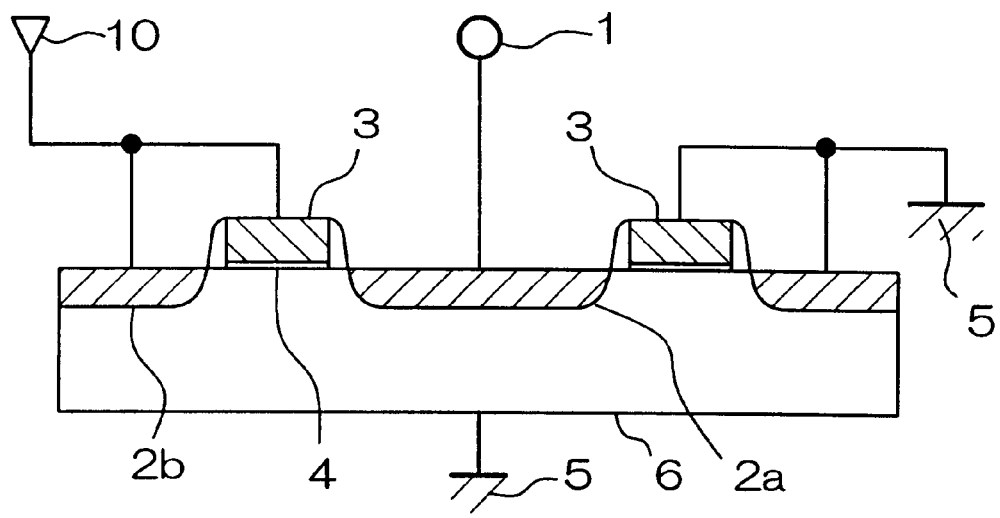
FIGS. 2A and 2B are, respectively, a sectional side view showing the structure of the input protection device of the semiconductor integrated circuit in Embodiment 2 and a circuit diagram showing its equivalent circuit.
Figure 2B:
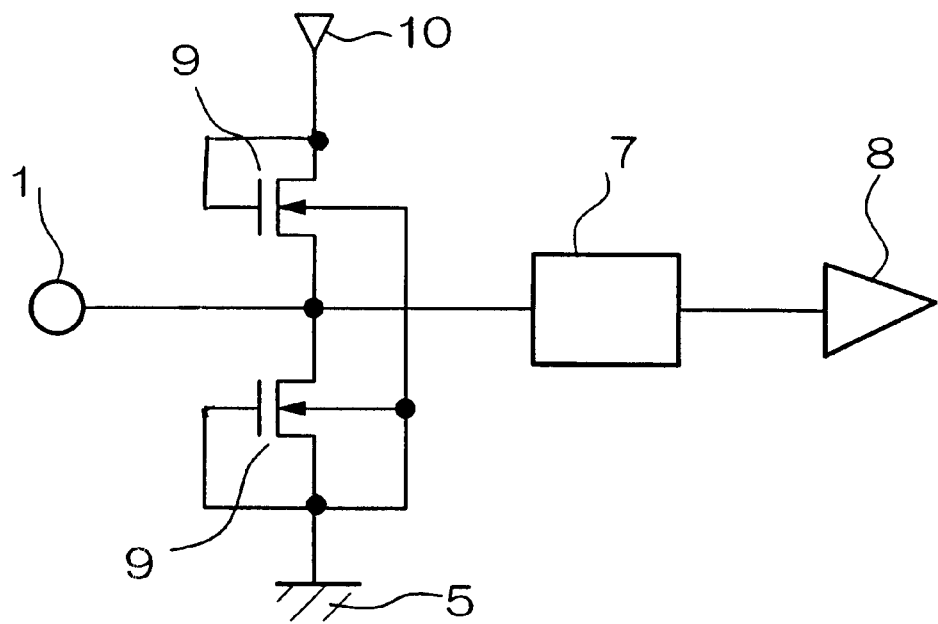
Figure 3A:
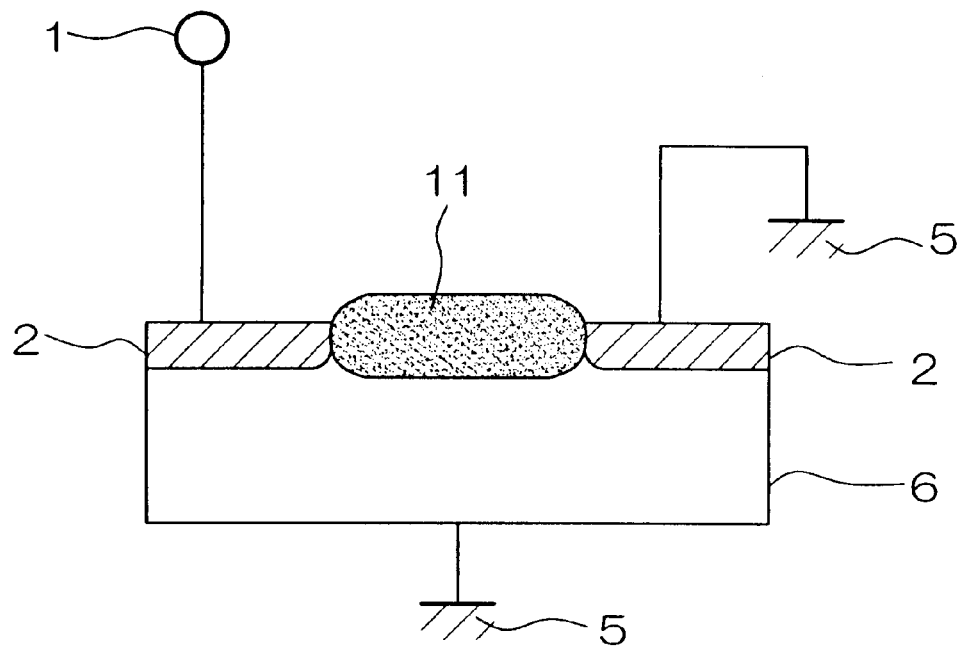
FIGS. 3A and 3B are, respectively, a sectional side view showing the structure of a conventional lateral bipolar transistor-type protection element (input protection device) having a field oxide, which is formed in a P-substrate, and a circuit diagram showing its equivalent circuit.
Figure 3B:
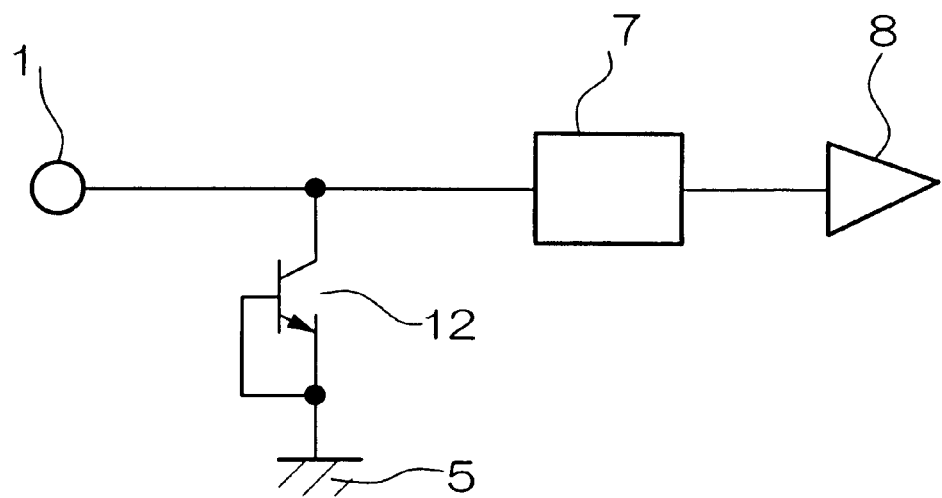
Figure 4A:
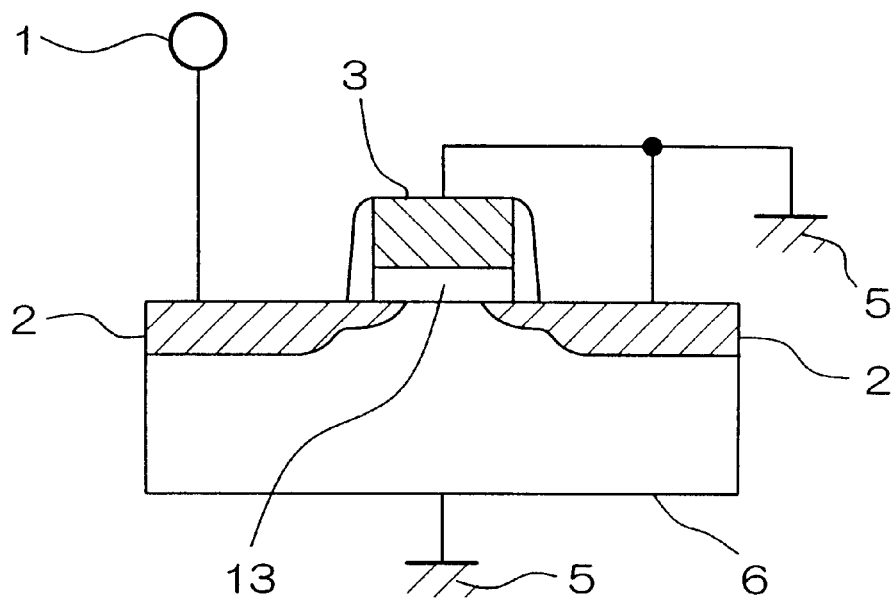
FIGS. 4A and 4B are, respectively, a sectional side view showing the structure of a conventional n-channel MOS transistor-type protection element (input protective device) having a thick gate oxide and a circuit diagram showing its equivalent circuit.
Figure 4B:
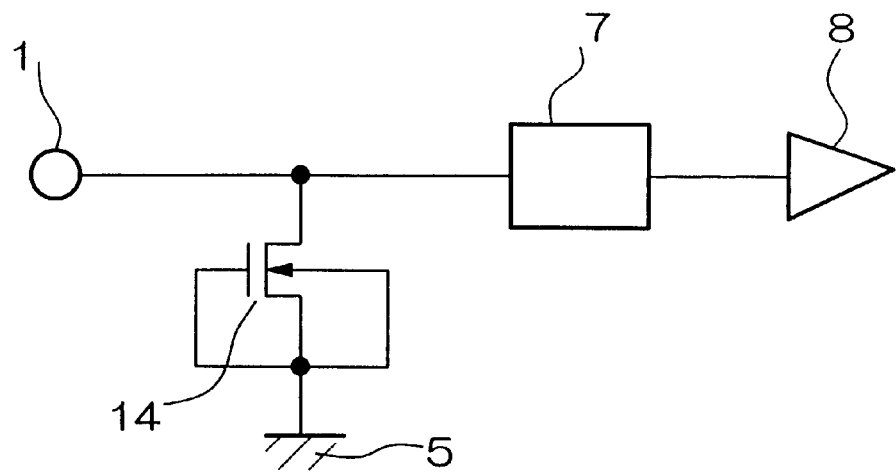

FIGS. 2A and 2B are, respectively, a sectional side view showing a structure of a semiconductor integrated circuit of Embodiment 2 and a circuit diagram showing its equivalent circuit. In these figures, components which are the same as those in Embodiment 1 (FIGS. 1A and 1B) also have the same reference numerals. In this embodiment, the offset NMOS transistor 9 of Embodiment 1 is provided as a protection element between an input terminal 1 and a grounding terminal 5, and another offset NMOS transistor 9 is similarly provided as a protective element between the input terminal 1 and a power supply terminal 10.

According to this embodiment, signals with voltages higher than the internal power supply voltage can be input, and a semiconductor integrated circuit having an enhanced protective function against static electricity and the like in comparison with a semiconductor integrated circuit having only one offset NMOS transistor 9 an input protection device can be realized.

What is claimed is:

1. A semiconductor integrated circuit comprising an input protection device which comprises a switching element and which is interposed between an input signal conductor and a grounding conductor so as to provide conduction from the input signal conductor to the grounding conductor when a signal voltage higher than a preset value is applied, wherein the switching element comprises an offset MOS transistor having at least one of a source region and a drain region of said transistor set back from a gate electrode of said transistor and wherein a thickness of an oxide layer of said gate electrode is essentially identical to a gate oxide layer thickness of a device protected by said switching element in that a same oxide layer is used for both said switching element gate oxide and said protected device gate oxide.

2. A semiconductor integrated circuit according to claim 1, to which a signal with a voltage higher than an internal power supply voltage is input through the input signal conductor.

3. A semiconductor integrated circuit according to claim 1, wherein either one region of a source region and a drain region of the offset MOS transistor is electrically connected to the input signal conductor, the other region is electrically connected to the grounding conductor, and a gate electrode of the offset MOS transistor is in an offset position from said one region.

4. A semiconductor integrated circuit according to claim 3, wherein the offset MOS transistor comprises an n-channel MOS transistor, and the gate electrode of the offset MOS transistor and said other region of the offset MOS transistor are grounded.

5. A semiconductor integrated circuit according to claim 1, wherein the offset MOS transistor has a field isolation structure in a trench structure.

6. A semiconductor integrated circuit according to claim 1, further comprising a second input protective device which comprises a second switching element and which is interposed between a power supply terminal at a predetermined potential and the input signal conductor, wherein the second switching element is an offset MOS transistor.

7. An overvoltage protection circuit for providing overvoltage protection of an input signal circuit node of an integrated circuit, said protection circuit having a single device for said protected node, said single device comprising:

a gate;

a source diffusion region; and a drain diffusion region connected to said protected node, wherein said drain is offset from said gate, said protected node is connected to at least one protected device having a gate with an oxide layer of a first thickness, and a thickness of an oxide layer of said gate of said protection device is essentially identical to said first thickness in that a same oxide layer is deposited for forming both said switching element gate oxide and said protected device gate oxide.

8. An overvoltage protection circuit for providing overvoltage protection of a circuit node of an integrated circuit, said protection circuit comprising:

a first protective device having a gate connected to a ground of said integrated circuit, a source diffusion region connected to said ground, and a drain diffusion region connected to said protected node; and a second protective device having a gate connected to a power supply node of said integrated circuit, a source diffusion region connected to said protected node, and a drain diffusion region connected to said power supply node, wherein each of said first protective device and said second protective device has an offset structure.

9. The overvoltage protection circuit of claim 8, wherein said protected node is connected to at least one protected device having a gate oxide layer of a first thickness, and wherein a thickness of an oxide layer of said first protective device and a thickness of an oxide layer of said second protective device are each essentially identical to said first thickness.

* * * * *